United States Patent
McTigue et al.

(10) Patent No.: US 9,857,392 B2
(45) Date of Patent: Jan. 2, 2018

(54) SINGLE ENDED TEST PROBE HAVING GROUND AND SIGNAL TIPS

(71) Applicant: Keysight Technologies, Inc., Minneapolis, MN (US)

(72) Inventors: Michael T. McTigue, Colorado Springs, CO (US); Jason Swaim, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 186 days.

(21) Appl. No.: 14/582,126

(22) Filed: Dec. 23, 2014

(65) Prior Publication Data
US 2016/0178664 A1 Jun. 23, 2016

(51) Int. Cl.
| G01R 31/02 | (2006.01) |
| G01R 31/11 | (2006.01) |
| G01R 31/28 | (2006.01) |
| G01R 1/067 | (2006.01) |
| G01R 1/073 | (2006.01) |
| G01R 1/18 | (2006.01) |

(52) U.S. Cl.
CPC ...... *G01R 1/06788* (2013.01); *G01R 1/06772* (2013.01); *G01R 1/18* (2013.01); *G01R 31/11* (2013.01)

(58) Field of Classification Search
CPC ........ G01R 31/02; G01R 31/11; G01R 31/28; G01R 1/067; G01R 1/073
USPC ....... 324/754.03, 754, 762, 158.1, 158, 537, 324/687, 725, 763.01
See application file for complete search history.

(56) References Cited

U.S. PATENT DOCUMENTS

| 5,373,231 A * | 12/1994 | Boll ................... G01R 1/06772 324/537 |
| 5,565,788 A | 10/1996 | Burr et al. |
| 6,051,978 A | 4/2000 | Swart |
| 2003/0025485 A1 | 2/2003 | McTigue |
| 2003/0193323 A1 | 10/2003 | McTigue |
| 2003/0193341 A1 | 10/2003 | McTigue |

(Continued)

OTHER PUBLICATIONS

TDR test probe model No. P8018 SE made by Tektronix, Inc. of Beaverton, OR; http://www.tek.com/sites/tek.com/files/media/media/resources/85W__16657__1.pdf.

(Continued)

*Primary Examiner* — Son Le
*Assistant Examiner* — Neel Shah

(57) ABSTRACT

A single-ended test probe includes a probe body such as a coaxial cable, a signal tip integral with the core (signal conductor), to ground arm having a ground tip and mounted to the coaxial cable, and an electrically conductive ground member projecting outside the coaxial cable and electrically conductively connecting the ground arm to the shield (ground conductor) of the coaxial cable. The ground member may be located closer to the end of the cable than the location at which the ground arm is mounted to the cable to minimize inductance in the connection between the probe and a device under test. The ground member may also be a cam by which the span between the ground and signal tips can be adjusted. Also, the test probe may include a second ground arm that is detachable connectable to the probe body independently of the first.

20 Claims, 6 Drawing Sheets

(56) References Cited

U.S. PATENT DOCUMENTS

| | | |
|---|---|---|
| 2003/0195713 A1* | 10/2003 | McTigue .......... G01R 1/06788 702/91 |
| 2004/0085057 A1 | 5/2004 | McTigue |
| 2004/0140819 A1 | 7/2004 | McTigue et al. |
| 2005/0237078 A1 | 10/2005 | Cannon et al. |
| 2006/0061348 A1* | 3/2006 | Cannon ............. G01R 1/06788 324/72.5 |
| 2007/0057682 A1 | 3/2007 | McTigue |
| 2007/0063714 A1 | 3/2007 | McTigue |
| 2007/0063715 A1* | 3/2007 | Cannon ............. G01R 1/06788 324/755.05 |
| 2007/0222468 A1 | 9/2007 | McTigue |
| 2008/0186036 A1 | 8/2008 | Shumaker |
| 2012/0119779 A1* | 5/2012 | Rousseau .......... G01R 1/06772 324/763.01 |
| 2012/0274338 A1 | 11/2012 | Baks et al. |
| 2013/0015870 A1* | 1/2013 | Nickel .............. G01R 31/2822 324/754.03 |

OTHER PUBLICATIONS

Single-Ended RF/TDR test probe made by HSProbe of Santa Clara, CA; http://www.hsprobe.com/RFProbe.html.

TDR Probe Model Nos. A0113866 and A0137855 made by Inter-Continental Microwave of Chandler, AZ; http://www.icmicrowave.com/.

Microwave Z Probe made by Cascade Microtech of Beaverton, OR.; https://www.cmicro.com/products/probes/rf-microwave/z-probe.

\* cited by examiner

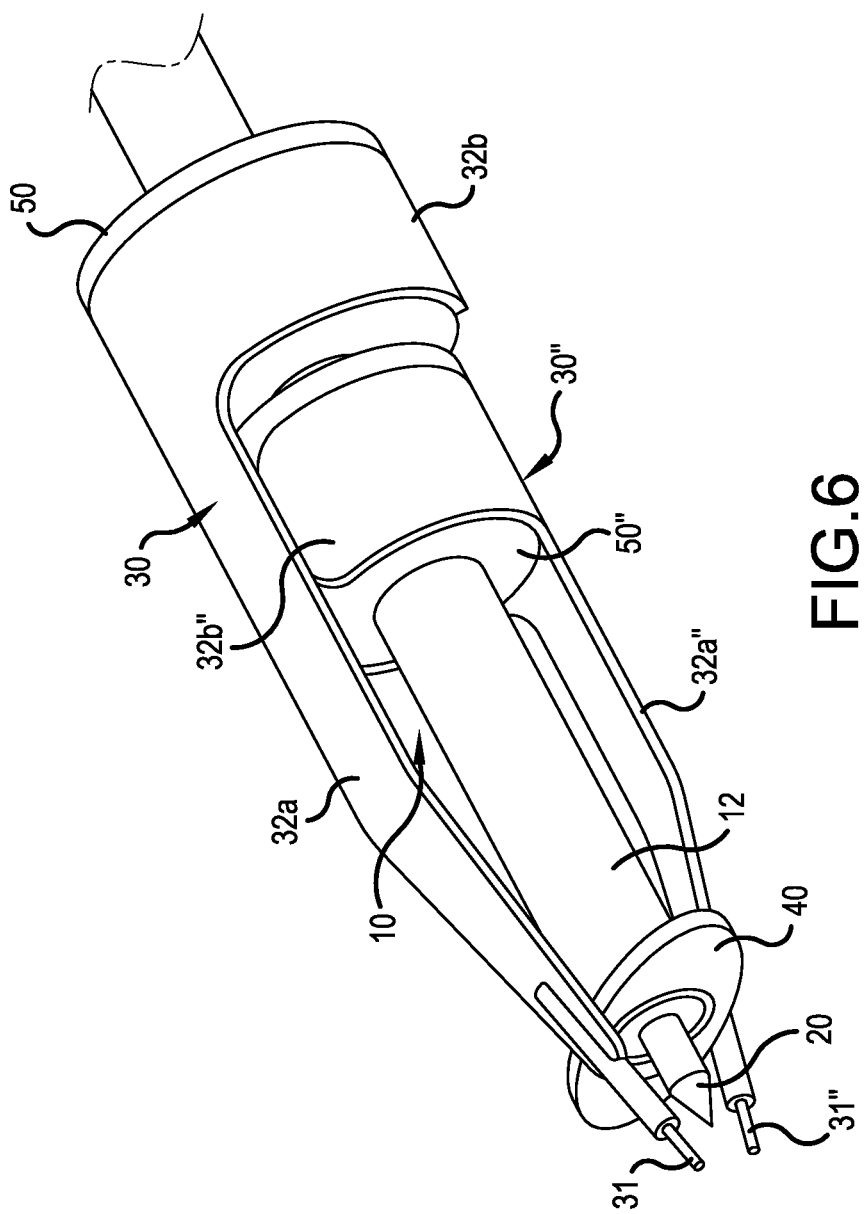

SINGLE ENDED TEST PROBE HAVING GROUND AND SIGNAL TIPS

BACKGROUND

Electronic products typically include a circuit board or substrate bearing conductive traces of circuitry of the product. During the prototyping or throughout the course of the manufacturing of an electronic product electrical characteristics of the product are tested to ensure proper design of the product or to monitor the manufacturing processes. This can be accomplished by establishing temporary electrical connections to the circuit traces using a test probe.

For example, line impedance of circuits is of significant interest to designers and manufacturers of electronic products having printed circuit boards (PCBs). Time-domain reflectometry is one technique for measuring line impedance. Various test probes have been developed to temporarily connect test points of the printed circuits of a PCB to instrumentation of a time-domain reflectometer (TDR). These test probes include a signal conductor and associated signal tip for delivering signals to/from the signal test point of the circuit, and a ground conductor and associated ground tip for providing a ground voltage to a ground test point of the circuit.

One class of such test probes employ a coaxial cable or 'coax' as the transmission line for temporarily connecting a device under test (DUT) to instrumentation of a TDR. In this case, the signal conductor is provided by the core of the coax and the ground conductor is provided by the shield of the coax. A typical impedance of a test probe comprising a coax is 50 Ohms. There are numerous commercially available probes that employ a 50 Ohm coax. Examples of these test probes include TDR test probe model number P8018 SE made by Tektronix, Inc. of Beaverton, Oreg., Single-Ended RF/TDR test probe made by HSProbe of Santa Clara, Calif. TDR Probe Model Nos. A0113866 and A0137855 made by Inter-Continental Microwave of Chandler, Ariz., and Microwave Z Probe made by Cascade Microtech of Beaverton, Oreg.

SUMMARY

As a representative embodiment there is provided a single-ended test probe which includes a coaxial cable, a signal up integral with the core of the cable at an end of the core and dedicated to contact a signal point of a device under test, a ground arm mounted to and supported by the coaxial cable at a first location along the length of the cable and having a ground tip dedicated to contact a ground point of the device under test, and an electrically conductive ground member projecting on the outside of the coaxial cable and electrically conductively connecting the ground arm to the shield at a second location offset from the first location along the length of the coaxial cable. The second location is between the first location and the around tip along the length of the coaxial cable. Therefore, the ground member minimizes inductance in the temporary electrical connection between the test probe and the points of the DUT being tested.

As another representative embodiment there is provided a single-ended test probe which includes a probe body including a signal conductor, and a ground conductor integral with the signal conductor but electrically isolated therefrom in the probe body, a signal tip integral with the signal conductor at an end thereof and dedicated to contact a signal point of a device under test, a ground arm have a ground tip dedicated to contact a ground, point of the device under test, the ground arm being mounted to the probe body so as to be rotatable relative to the probe body in a direction about the signal and ground conductors, collectively, and a span-adjusting cam projecting on the outside of the probe body and electrically conductively connected to the ground conductor of the probe body. The cam is engaged by the ground arm outside the probe body such that a distance between the signal tip and the ground tip changes as the ground arm is rotated relative to the probe body.

As still another representative embodiment, them is provided a single-ended test probe which includes a probe body including a signal conductor, and a ground conductor integral with the signal conductor but electrically isolated therefrom in the probe body, as signal tip integral with the signal conductor at an end thereof and dedicated to contact a signal point of a device under test, two ground arms having ground tips, respectively, dedicated to contact ground points of the device under test, and an electrically conductive ground member projecting outside the probe body and electrically conductively connected to the ground conductor of the probe body, and in which the ground arms are detachably mounted to the probe body independently of one another each in a position at which the ground arm contacts the ground member so as to be electrically conductively connected to the ground conductor of the probe body. Therefore, the probe can selectively provide a ground-signal configuration and a ground-signal-ground configuration.

BRIEF DESCRIPTION OF THE DRAWINGS

FIG. 6 is a perspective view of a representative embodiment of a test probe in a ground-signal-ground configuration.

DETAILED DESCRIPTION

Figure 1:
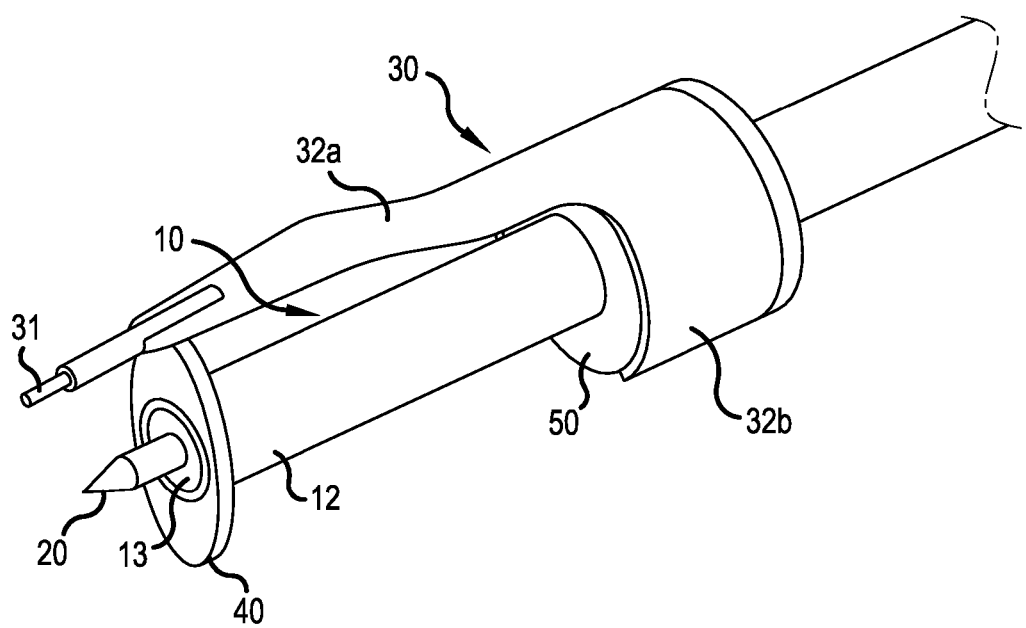
FIG. 1 is a perspective view of a representative embodiment of as test probe.

In the following detailed description, for purposes of explanation and not limitation, representative embodiments disclosing specific details are set forth in order to provide a thorough understanding, of the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art may be used in accordance with the representative embodiments.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein. These directional phrases are intended to encompass different orientations of an element in addition to the orientation depicted in the drawings. For example, if an element were inverted with respect to the view in the drawings, an element described as "above" another element, for example, would now be "below" that element. Similarly, if an element were rotated by 90° with respect to the view in the drawings, an element described "above" or "below" another element would now be "adjacent" to the other element; where "adjacent" means either abutting the other element, or having one or more layers, materials, structures, etc., between the elements.

Like numbered elements in these figures are either equivalent elements or perform the same function. Elements which have been discussed previously will not necessarily be discussed in later figures if the function is equivalent.

Representative embodiments relate to the testing of an electronic product, component, circuit or the like. In particular, representative embodiments relate to a test probe for creating a temporary electrical connection to ground and signal test points of a device under test (DUT).

A representative embodiment of a single-ended test probe will now be described with reference to FIGS. 1-5. The test probe generally includes a probe body 10, a signal tip 20, at least one ground arm 30, and an electrically conductive ground member 40. The probe body 10 includes a signal conductor 11, and a ground conductor 12 integral with the signal conductor 11 but electrically isolated from the signal conductor 11 in the probe body 10.

The probe body 10 may comprise a rigid or semi-rigid coaxial cable (which may be referred to hereinafter as a 'coax'). The coax may comprise a 50 Ohm launch or coax. In the representative embodiment (best shown by FIG. 3), the signal conductor 11 is an electrically conductive core of a coax and the around conductor 12 is an electrically conductive shield of the coax extending around the core as disposed concentrically with respect to the core. Also, a layer of insulating material 13 is interposed between the core (signal conductor 11) and the shield (ground conductor 12). The insulating material 13 may be a dielectric material and the core and shield may comprise copper. Furthermore, the coax may have an outer jacket of insulating material (not shown) along part of its length, and which may be stripped away or otherwise not formed at the end of the coax shown in the figures.

The signal tip 20 is integral with the signal conductor 11 at an end 11a of the signal conductor. In this respect, the signal tip 20 may be formed of a hard metal ground to a point so as to be harder and sharper than if the end of the signal conductor 11 were used to form the tip, especially in the case of a coax. In any case, the signal tip 20 is dedicated to contact a signal point of a device under test (DUT) such that signals can be transmitted to and from the signal point via the signal tip 20 and signal conductor 11. The ground arm 30 is mounted to and supported by the coax and has a ground tip 31 dedicated to contact a ground point of the DUT. The electrically conductive ground member 40 projects at the outside of the probe body 10 and electrically conductively connects the ground arm 30 to the round conductor 12, e.g., to the shield of the coax. For example, the electrically conductive ground member 40 is soldered to the ground conductor 12.

In the representative embodiment, the ground arm 30 is mounted to and supported by the coax at a first location L1 (FIG. 3) along the length of the coax, the electrically conductive ground member 40 electrically conductively connects the ground arm 30 to the shield (ground conductor 12) at a second location L2 offset from the first location L1 along the length of the coax, and the second location L2 is between the first location L1 and a location L3 of the ground tip as viewed along the length of the coax. That is, the electrical connection of the ground arm 30 does not occur at the location where the ground arm 30 is physically attached to the coax but at a point significantly closer to ground tip 31. Thus, the ground arm 30 may be relatively large and correspondingly robust and yet, the inductance in the connection constituted by the signal and ground tips 20, 31 may be relatively low. The inductance of the connection is determined in this embodiment by the loop formed through the ground tip 31, the electrically conductive ground member 40, the shield of the coax and the signal tip 20. A substantial part of the ground arm 30 and, in this example, the majority of the ground arm 30, is not part of the loop. That is, the inductance in the connection is significantly lower than if the point at which the electrical connection between the ground arm and the shield were to coincide with a point of physical attachment of the ground arm to the coax. Accordingly, the bulk of the ground arm 30 has no affect on the electrical performance of the test probe.

In this way, a test probe may overcome the difficulty of establishing a useful temporary connection between a 50 Ohm coax (or other impedance) and ground and signal test points of a OUT. This difficulty arises because at such a low 50 Ohm impedance level, inductance in the connection will significantly affect the achievable bandwidth and make it difficult to rid the connection of unwanted input signals common to the signal and ground tips, make it difficult to realize a satisfactory common mode rejection (CMR).

Figure 2:
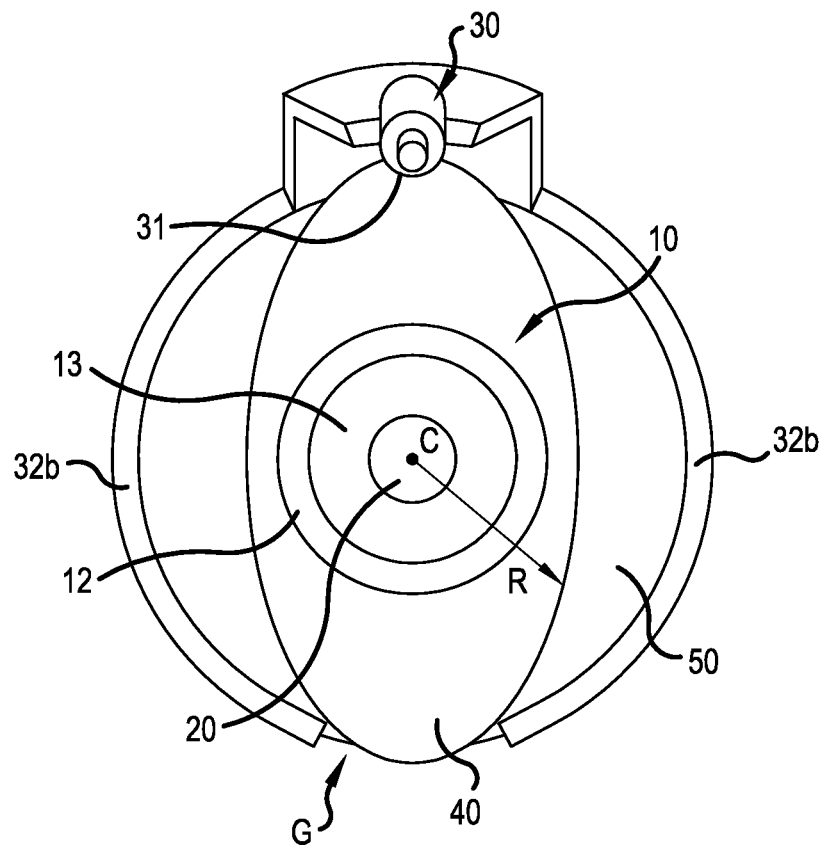
FIG. 2 is an end view of the test probe when in the position shown FIG. 1.

In addition, the electrically conductive ground member 40 may be a span-adjusting cam (also referenced with reference character 40). Cam 40 projects radially outwardly from the probe body 10. Referring in particular to FIG. 2, a longitudinal axis of the cam 40 coincides with a longitudinal axis C of the probe body 10 (and, in the illustrated example in which the probe body 10 is a coax, the central longitudinal axis of the coax). The cam 40 has a radius R that varies. The outer peripheral surface of the cam 40 is engaged by the ground arm 30 in a state in which the ground arm is self-biased against the cam 40. More specifically with respect to the representative embodiment, in addition to the ground tip 31, the ground arm 30 includes an arm portion 32a having a distal end supporting the ground tip 31, and one or more wings 32b extending from a proximal end of the arm portion 32a and by which the ground arm 30 is mounted to the probe body 10. The arm portion 32a is supported as a cantilever by the wing(s) 32b so as to be a spring arm flexed into engagement with the cam 40.

Furthermore, the ground arm 30 is mounted to the probe body 10 such that it is rotatable about the axis C of the probe body 10 and hence, about the signal and ground conductors 11, 12 of the probe body 10. Therefore, a distance (the span) between the signal tip and the ground tip changes as the ground arm 30 is rotated relative to the probe body 10. This allows for the test probe to accommodate for different spacings between the signal point and the ground point of the DUT.

Figure 3:
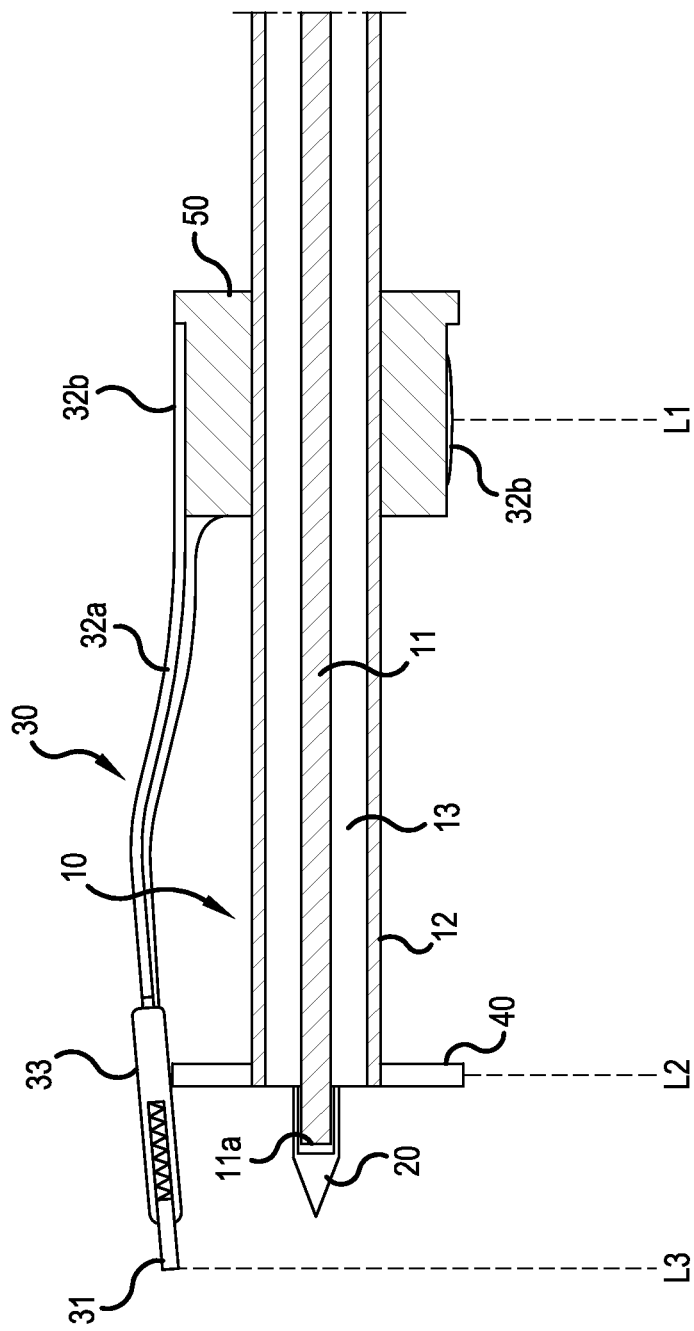
FIG. 3 is a longitudinal sectional view of the test probe.
Figure 4:
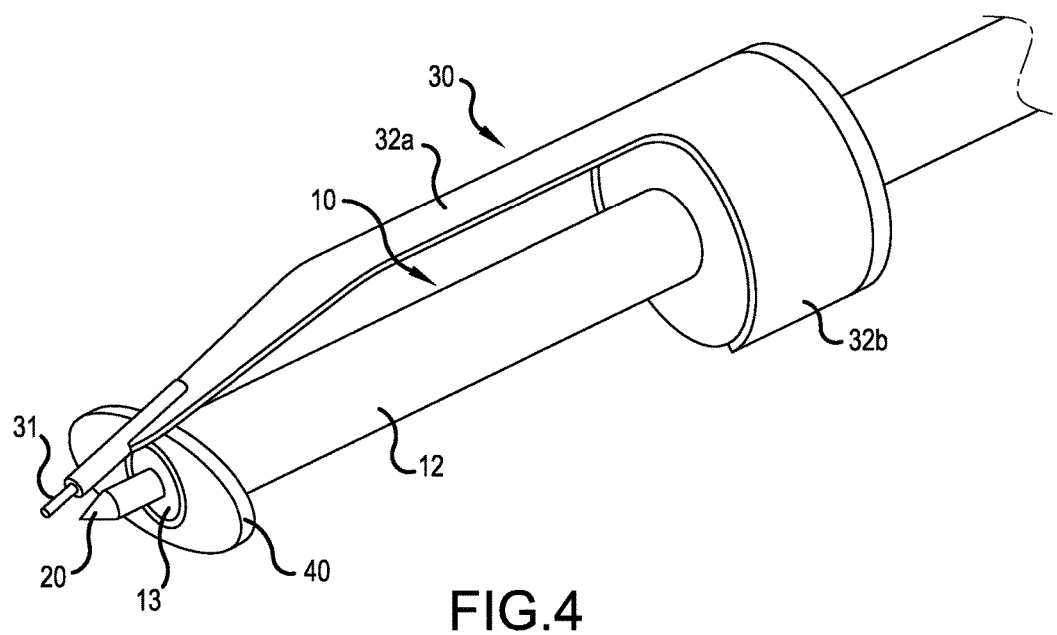
FIG. 4 is a perspective view of the test probe but showing it adjusted to establish a different span between its signal and ground tips.
Figure 5:
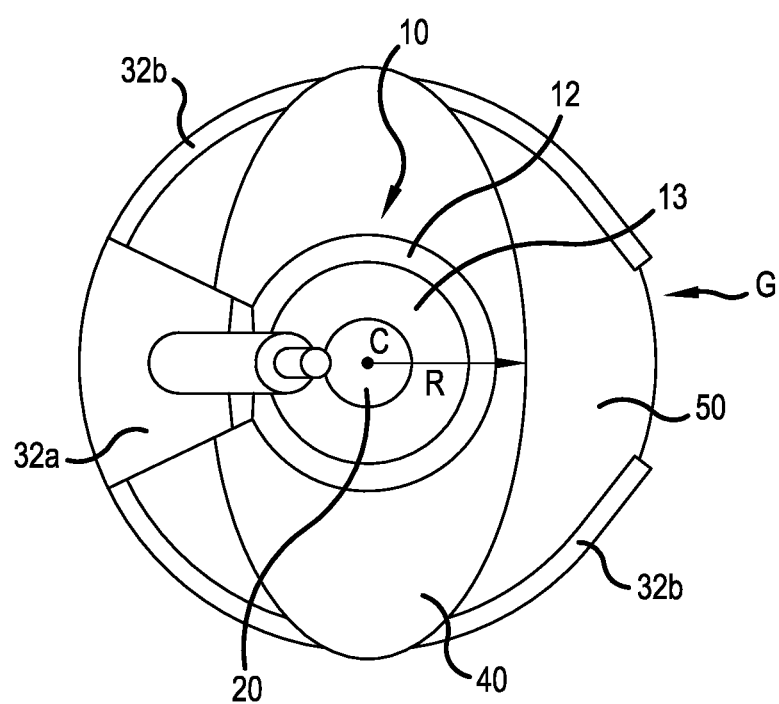
FIG. 5 is an end view of the test probe when in the position shown in FIG. 4.

FIGS. 1-3 illustrate a state in which the span between the signal tip 20 and the ground tip 31 is maximum. Rotating the ground arm 30 about the probe body 10 from the position shown in FIGS. 1-3 will decrease the span. FIGS. 4 and 5 show the test probe adjusted in this way to a position at which a minimum span exists between the signal tip 20 and the ground tip 31. The minimum span allows for contact with test points spaced very close together, such as the those of SMT (surface mount technology) components. Note, also, although the cam 40 is shown as being elliptical, the cam 40 may instead have other forms such as the form of a disk that is eccentric with respect to the axis of rotation of the ground arm 30.

Also, in the representative embodiment, the wing(s) 32b of the ground arm 30 is/are arcuate and has/have a radius of curvature emanating from a point coinciding with the axis of the cam 40. A bushing 50 of an electrical insulator and having a cylindrical outer surface may be mounted to the probe body 10. In the case in which the probe body is a coax, the bushing 50 may be mounted directly to the shield of the coax such that the bushing 50 and the coax are concentric. The radius of curvature of the arcuate wing(s) 32b and the outer diameter of the bushing 50 at its cylindrical surface are equal, and the arcuate wing(s) 3b2 of the ground arm 30 extend(s) along more than half of the circumference of the bushing 50 such that the wing(s) 32b are slidable along and guided by the outer cylindrical surface of the bushing 50 when the ground arm 30 is rotated, and such that the ground arm 30 is retained on the bushing 50. Although the bushing 50 is shown and described as being cylindrical, the bushing 50 may be semi-cylindrical providing just enough of a cylinder to facilitate the mounting of the ground arm 30 to the probe body 10 and the necessary amount of rotation to achieve a desired maximum span between the signal tip 20 and the ground tip 31.

Furthermore, although the bushing 50 has been described as being a discrete element mounted to the probe body 10, the bushing 50 may be considered as part of the probe body. That is, the bushing 50 may be considered as an insulating member of the probe body 10, extending around the ground conductor 12 and the signal conductor 11 of the probe body 10. Similarly, the bushing 50 may also be unitary or integral with an outer insulating jacket of the probe body. Also, the bushing 50 itself may be omitted in the case in which the probe body 10 is a coax having an outer insulating jacket extending to at least the mounting, location L2; in this case, the wing(s) 32 of the ground arm 30 may be sized to fit directly on the outer insulating jacket.

Also, a gap G may be provided in the wing(s) 32 in the circumferential direction of the probe body 10 and the wing(s) 32 may be flexible enough to allow them by means of the provision of this gap G to serve as a clip by which the ground arm 30 may be clipped and hence, detachably mounted, to probe body 10.

The common plane in which the contact points of the signal tip 20 and the ground tip 31 lie may skew as the span between the tips is adjusted, due to the cantilevered form of the ground arm 30, for example. If the test probe is embodied as a hand probe, this can be compensated for by simply adjusting the angle of the probe body relative to the surface containing the test and ground points. Furthermore, in the representative embodiment, at least one of the signal tip 20 and the ground tip 31 may have compliance in a Z-axis direction corresponding substantially to the lengthwise direction of that end of the probe body (e.g., coax which includes the end 11a of the ground conductor (core) from which the signal tip 20 extends. For example, the signal tip 20 and/or the ground tip 31 may be constituted by a pogo pin. In the representative embodiment, the ground arm 30 comprises a pogo pin 33 that at include the ground tip 31. Therefore, the signal and test points of the DUT may be contacted by the signal tip 20 and the ground tip 31 of the test probe with any of the set spans between the signal and ground tips 20, 31 and without damage to the test points or probe tips.

FIG. 6 shows a test probe according to a representative embodiment that can selectively provide a ground-signal (GS) configuration and a ground-signal-ground (GSG) configuration.

To this end, in addition to ground arm 30, the test probe has a second ground arm 30" and the second ground arm 30" may be similar to the ground arm 30 in all respects so as to have a ground tip 31", arm portion 32a", arcuate wing(s) 32", etc. The around arms 30, 30" are detachably mounted to the probe body independently of one another, each in a position at which the ground arm contacts the electrically conductive ground member 40 so as to be electrically conductively connected to the ground conductor 12 of the probe body 10. Thus, when only one of the ground arms 30, 30" is attached to (e.g., clipped onto) the probe body 10, the test probe as shown in FIGS. 1-5 has a ground-signal configuration by which the test probe can be simultaneously connected to one ground test point and a signal test point of the DUT. On the other hand, when both of the ground arms 30, 30" are attached to (e.g., clipped onto) the probe body 10, the test probe as shown in FIG. 6 has a ground-signal configuration by which the test probe can be simultaneously connected to two ground test points and a signal test point of the DUT.

Also, as can be seen in FIG. 6, the ground arms 30, 30" are mounted to the probe body 10 at different locations along the length of the probe body. To this end, the ground arms 30, 30" may be mounted to bushings 50, 50", respectively, spaced along the length of the probe body 10. The bushings 50, 50" have different outer diameters with the hushing 50" having the smaller diameter being disposed closer to the end of the probe body 10 than the larger-diameter bushing 50. The ground arms 30, 30" are sized accordingly. Therefore, the arm portion 32 of the ground arm 30 is spaced outwardly relative to the second ground anti 30". Hence, the ground arms 30, 30' can be rotated independently of one another.

Furthermore, in an example of the test probe shown in FIG. 6, the electrically conductive ground member 40 is an elliptical cam. When the test probe has the ground-signal-ground configuration, this allows for the span between one of the ground tips 31, 31" and the signal tip 20 to be equal to the span between the other of the ground tips 31, 31" and the signal tip 20 no matter what the span. That is, as long as the ground tips 31, 31" are located diametrically across the cam 40 from each other, the spans between the signal tip 20 and the ground tips 31, 31" will be the same. On the other hand, some testing may require a unique span between one of the ground tips 31, 31" which is also allowed for because the ground arms 30, 30" are independently rotatable.

As described above, there is provided a single-ended test probe that can facilitate the temporary connection of a 50 Ohm coax (or other impedance) to ground and signal points of a device under test (DUT) while retaining a high bandwidth and enabling common mode rejection (CMR) during testing. There is also provided a single-ended test probe having relatively simple and compact means of providing a variable span between ground and signal tips without compromising the visibility of the tips as they are being placed in contact with ground and signal points of a DUT, making hand-probing possible and easy. The test probe is relatively robust and which robustness may be enhanced through the provision of compliant ground and/or signal tips. There is also provided a single-ended test probe that provides the option to have a ground-signal-ground configuration (GSG) in addition to just a ground-signal (GS) configuration.

Finally, representative embodiments and examples thereof have been described above in detail. However, the representative embodiments and examples thereof were described so that this disclosure is thorough and complete to those skilled in the art. Thus, a true spirit and scope is not limited by the representative embodiments and examples described above but by the following claims.

The invention claimed is:

1. A single-ended test probe comprising:
a coaxial cable including an electrically conductive core, an electrically conductive shield extending around the core, and an insulating layer interposed between the core and the shield;
a signal tip integral with the core at an end of the core and dedicated to contact a signal point of a device under test;
a ground arm mounted to and supported by the coaxial cable at a first location along a length of the cable, the ground arm having a ground tip dedicated to contact a ground point of the device under test; and
an electrically conductive ground member projecting on the outside of the coaxial cable and electrically conductively connecting the ground arm to the shield at a second location offset from the first location along the length of the coaxial cable, the second location being between the first location and the ground tip along the length of the coaxial cable.

2. The single-ended test probe as claimed in claim 1, wherein at least one of the ground tip and the signal tip is compliant in a Z-axis direction corresponding substantially to a lengthwise direction of an end of the coaxial cable which includes said end of the core.

3. The single-ended test probe as claimed in claim 2, wherein said at least one of the ground tip and the signal tip is constituted by a pogo pin.

4. The single-ended test probe as claimed in claim 1, wherein the ground arm is mounted to the coaxial cable so as to be rotatable at said first location in a direction about the cable, and the electrically conductive ground member is a cam having an outer peripheral surface engaged by the ground arm such that a distance between the signal tip and the ground tip changes as the ground arm is rotated relative to the cable.

5. The single-ended test probe as claimed in claim 1, wherein the ground arm comprises a clip by which the ground arm is detachably connected to the coaxial cable at said first location.

6. The single-ended test probe as claimed in claim 5, wherein the ground arm is a first ground arm, and the single-ended test probe further comprising a second ground arm comprising a clip by which the second ground arm is detachably connected to the coaxial cable at a third location along the length of the cable, the second ground arm having a ground tip dedicated to contact a ground point of the device under test, and the electrically conductive ground member electrically conductively connecting the second ground arm to the shield.

7. The single-ended test probe as claimed in claim 6, wherein each of the first and second ground arms is mounted to the coaxial cable so as to be rotatable about the cable, and the electrically conductive ground member is a cam contacting the shield of the coaxial cable and having an outer peripheral surface engaged by the first and second ground arms such that a distance between the signal tip and the ground tip of each of the ground arms changes as the ground arm is rotated relative to the cable.

8. The single-ended test probe as claimed in claim 7, wherein the cam has an elliptical outer peripheral surface engaged by the first and second ground arms.

9. A single-ended test probe comprising:
a probe body including a signal conductor, and a ground conductor integral with the signal conductor but electrically isolated therefrom in the probe body;
a signal tip integral with the signal conductor at an end thereof and dedicated to contact a signal point of a device under test;
a ground arm have a ground tip dedicated to contact a ground point of the device under test, the ground arm being mounted to the probe body so as to be rotatable relative to the probe body in a direction about the signal and ground conductors, collectively; and
a span-adjusting cam projecting on the outside of the probe body and electrically conductively connected to the ground conductor of the probe body, and wherein the cam is engaged by the ground arm outside the probe body such that a distance between the signal tip and the ground tip changes as the ground arm is rotated relative to the probe body.

10. The single-ended test probe as claimed in claim 9, wherein at least one of the ground tip and the signal tip is compliant in a Z-axis direction corresponding substantially to a lengthwise direction of an end of the probe body which includes said end of the signal conductor.

11. The single-ended test probe as claimed in claim 10, wherein said at least one of the ground tip and the signal tip is constituted by a pogo pin.

12. The single-ended test probe as claimed in claim 9, wherein the ground arm comprises a clip by which the ground arm is detachably connected to the probe body.

13. The single-ended test probe as claimed in claim 12, wherein the ground arm is a first ground arm, and the single-ended test probe further comprises a second ground arm comprising a clip by which the second ground arm is detachably connected to the probe body, the second ground arm having a ground tip dedicated to contact a ground point of the device under test, and wherein the cam electrically conductively connects the second ground arm to the ground conductor of the probe body.

14. The single-ended test probe as claimed in claim 13, wherein each of the first and second ground arms is mounted to the probe body so as to be rotatable about the probe body, and
a cam contacting the probe body ground and having an outer peripheral surface engaged by the first and second ground arms such that a distance between the signal tip and the ground tip of each of the ground arms changes as the ground arm is rotated relative to the probe body.

15. The single-ended test probe as claimed in claim 14, wherein the cam has an elliptical outer peripheral surface engaged by the first and second ground arms.

16. The single-ended test probe as claimed in claim 9, wherein the probe body comprises a coaxial cable, the signal conductor is a core of the coaxial cable and the ground conductor is a shield extending around the core.

17. A single-ended probe comprising:
a probe body comprising a signal conductor, and a ground conductor integral with the signal conductor but electrically isolated therefrom in the probe body;
a signal tip integral with the signal conductor at an end thereof and dedicated to contact a signal point of a device under test;
two ground arms, each having a ground tip dedicated to contact ground points of the device under test, wherein each of the two ground arms are adapted to be mounted to and supported by a coaxial cable at a first location along a length of the coaxial cable; and
an electrically conductive ground member projecting outside the probe body and electrically conductively connected to the ground conductor of the probe body, the electrically conducting ground member being connecting the ground arms to a shield of the coaxial cable at a second location offset from the first location along the length of the coaxial cable, the second location being between the first location and the ground tip along the length of the coaxial cable, and
wherein the ground arms are detachably mounted to the probe body independently of one another, each in a position at which the ground arms contact the electrically conductive ground member so as to be electrically conductively connected to the ground conductor of the probe body, whereby the probe can selectively provide a ground-signal configuration and a ground-signal-ground configuration.

18. The single-ended test probe as claimed in claim 17, wherein at least one of the ground tip and the signal tip is compliant in a Z-axis direction corresponding substantially to a lengthwise direction of an end of the probe body which includes said end of the signal conductor.

19. The single-ended test probe as claimed in claim 18, wherein said at least one of the ground tip and the signal tip is constituted by a pogo pin.

20. The single-ended test probe as claimed in claim 17, wherein the probe body comprises a coaxial cable, the signal conductor is a core of the coaxial cable and the ground conductor is a shield extending around the core.

* * * * *

UNITED STATES PATENT AND TRADEMARK OFFICE
CERTIFICATE OF CORRECTION

PATENT NO. : 9,857,392 B2
APPLICATION NO. : 14/582126
DATED : January 2, 2018
INVENTOR(S) : Michael T. McTigue et al.

Page 1 of 1

It is certified that error appears in the above-identified patent and that said Letters Patent is hereby corrected as shown below:

On the Title Page

In item (57), in Column 2, in "Abstract", Line 3, delete "to ground" and insert -- a ground --, therefor.

Signed and Sealed this
Thirteenth Day of March, 2018

Andrei Iancu
*Director of the United States Patent and Trademark Office*